United States Patent
Fu et al.

(10) Patent No.: US 6,316,348 B1
(45) Date of Patent: Nov. 13, 2001

(54) HIGH SELECTIVITY SI-RICH SION ETCH-STOP LAYER

(75) Inventors: Chu Yun Fu, Taipei; Chia Shiung Tsai; Syun-Ming Jang, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/838,627

(22) Filed: Apr. 20, 2001

Related U.S. Application Data

(62) Division of application No. 09/245,564, filed on Feb. 5, 1999, now Pat. No. 6,245,669.

(51) Int. Cl.[7] ............ H01L 21/4763; H01L 21/336; H01L 21/3205
(52) U.S. Cl. ............ 438/636; 438/229; 438/233; 438/303; 438/595; 438/622; 438/637; 438/696; 438/706; 438/736
(58) Field of Search ............ 438/299, 303, 438/622, 624, 636, 637–640, 696, 700, 702, 703, 735–738, 585–586, 595, 229, 230, 233, 710

(56) References Cited

U.S. PATENT DOCUMENTS

| | | | |
|---|---|---|---|
| 4,870,470 | 9/1989 | Bass, Jr. et al. | 357/23.5 |
| 4,871,689 | 10/1989 | Bergami et al. | 437/67 |
| 5,252,515 | 10/1993 | Tsai et al. | 437/195 |
| 5,378,659 | 1/1995 | Roman et al. | 437/229 |
| 5,731,242 | * 3/1998 | Parat et al. | 438/586 |
| 5,741,626 | 4/1998 | Jain et al. | 430/314 |
| 5,817,562 | * 10/1998 | Chang et al. | 438/305 |
| 6,087,271 | * 7/2000 | En et al. | 438/745 |

FOREIGN PATENT DOCUMENTS

0846186 * 2/1996 (JP).
0846188 * 2/1996 (JP).

* cited by examiner

Primary Examiner—Charles Bowers
Assistant Examiner—Thanhha Pham
(74) Attorney, Agent, or Firm—George O. Saile; Stephen B. Ackerman; William J. Stoffel

(57) ABSTRACT

The present invention provides an anti-reflective Si-Rich Silicon oxynitride (SiON) etch barrier layer and two compatible oxide etch processes. The Si-Rich Silicon oxynitride (SiON) etch barrier layer can be used as a hard mask in a dual damascene structure and as a hard mask for over a polysilicone gate. The invention has the following key elements: 1) Si rich Silicon oxynitride (SiON) ARC layer, 2) Special Silicon oxide Etch process that has a high selectivity of Si-Rich SiON to silicon oxide or SiN; 3) Special Si Rich SiON spacer process for a self aligned contact (SAC).

A dual damascene structure is formed by depositing a first dielectric layer. A novel anti-reflective Si-Rich Silicon oxynitride (SiON) etch barrier layer is deposited on top of the first dielectric layer. A first opening is etched in the first insulating layer. A second dielectric layer is deposited on the anti-reflective Si-Rich Silicon oxynitride (SiON) etch barrier layer. A second dual damascene opening is etched into the dielectric layers. The anti-reflective Si-Rich Silicon oxynnitride (SiON) etch barrier layer can also serve as an ARC layer during these operations to reduce the amount of reflectance from conductive region to reduce distortion of the photoresist pattern.

4 Claims, 4 Drawing Sheets

HIGH SELECTIVITY SI-RICH SION ETCH-STOP LAYER

This is a division of patent application Ser. No. 09/245,564, filing date Feb. 5, 1999 now U.S. Pat. No. 6,245,669, High Selectivity SI-Rich Sion Etch Stop Layer, assigned to the same assignee as the present invention.

BACKGROUND OF INVENTION

1) Field of the Invention

The present invention relates to semiconductor devices in general, and more particularly to semiconductor devices having anti-reflective coatings and hard masks to aid in photolithography steps, such as those used to form in a dual damascene interconnect structure and gate electrodes.

2) Description of the Prior Art

The semiconductor industry's continuing drive toward integrated circuits with ever decreasing geometries, coupled with its pervasive use of highly reflective materials, such as polysilicon, aluminum, and metal suicides, has lead to increased photolithographic patterning problems. Unwanted reflections from these underlying reflective materials during the photoresist patterning process often cause the resulting photoresist patterns to be distorted.

Anti-reflective coatings (ARCs) have been developed to minimize the adverse impact due to reflectance from these reflective materials. In many instances, these ARCs are conductive materials which are deposited as a blanket layer on top of metal and simultaneously patterned with the metal to form interconnects. A problem with these ARCs is that many of these materials cannot be used in applications such as dual damascene, wherein the metal layer is not patterned. In a dual damascene application, openings are formed in the interlayer dielectric, and the metal is blanket deposited in those openings and subsequently polished back to form a planar inlaid plug. In such application, the metal layer is never etched and therefore, any conductive ARC on top of the inlaid metal would cause the metal plugs to be electrically short circuited together through the conductive ARC.

Some dielectric ARCs are also known, such as conventional silicon rich silicon nitride or aluminum nitride, but a disadvantage with these conventional ARCs is that they are most suitable for deep ultraviolet (DUV) radiation, whereas a vast majority of photolithography steps occur at higher wave lengths such as I-line or G-line where these ARCs are not optimal.

Accordingly, there is a need for an improved semiconductor manufacturing operation which utilizes an anti-reflective coating that is applicable to the more prevalent I-line or G-line lithographies and which can be used in applications, such as dual damascene, which require ARCs that are nonconductive and potentially used as a damascene etch stop layer.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,378,659(Roman) shows a Si-Rich SiN layer as an ARC layer for DUV.

U.S. Pat. No. 5,252,515(Tsai et al.) shows a Si-Rich Silicon oxynitride barrier layer.

U.S. Pat. No. 4,871,689 (Bergami) shows a Si-rich Silicon oxynitride layer for a dielectric filled trench.

U.S. Pat. No. 4,870,470(Bass et al. ) shows a Si rich Silicon oxynitride layer for a charge trapping layer in an EEPROM.

U.S. Pat. No. 5,741,626(Jain) shows a dual damascene process.

SUMMARY OF THE INVENTION

It is an object of the present invention to provide a method for fabricating a Dual damascene interconnect structure using a Novel Si-rich SiON ARC etch barrier layer.

It is an object of the present invention to provide a method for fabricating a Dual damascene interconnect structure using a Novel Si-rich SiON ARC etch barrier layer and special silicon oxide etch that has a high selectivity to Si-Rich SiON and SiN.

It is an object of the present invention to provide a method for fabricating gate using a Novel Si-rich SiON ARC etch barrier layer (hard mask) that has a Si-rich SiON self aligned contact (SAC) structure.

It is an object of the present invention to provide process to form a Si Rich SiON layer and an $SiO_2$ etch process implemented in two preferred embodiments: ① a Dual damascene structure and ② a self aligned contact (SAC) structure.

It is an object of the present invention to provide an $Sio_2$ etch process that has a higher etch selectivity of Si-Rich SiON to oxide than compared with that of SiON and PE nitride.

It is an object of the present invention to provide a method for fabricating a capacitor having a high density and capacitance.

In general the invention teaches a specialized process for forming structure using a Si rich Silicon oxynitride (SiON) etch stop layer (Refractive index (RI)=2.7 measured at 633 nm). This Si-rich SiON layer can also be used as an ARC film for I-line photo.

The invention has two preferred embodiments where the invention's Si rich SiON layers are used in semiconductor structures: ① a dual damascene structure with using the invention's Si rich SiON etch stop layer and ② a polysilicon line/gate self aligned contact (SAC) structure where the invention's Si rich SiON etch stop layer.

A second major feature of the invention is a specialized $SiO_2$ etch that has a high selectivity for invention's Si-rich SiON.

Generally, the first embodiment of the present invention involves using a dielectric phase of Si Rich Silicon oxynitride Anti-Reflection Coating (ARC) layer in conjunction with damascene or dual inlaid metalization processing. Specifically, a conductive region/line is provided overlying the surface of a semiconductor wafer. A damascene-type contact is etched to expose the conductive region. The invention's damascene process involves deposition of two dielectric layers with a Novel Si Rich silicon oxynitride ARC layer in the middle as an etch stop material. An opening with a small width (via) is formed using the Novel Si Rich silicon oxynitride Anti-Reflection Coating (ARC) layer as an etch stop. In a key step, a specialized $SiO_2$ etch process is used to form a larger opening (interconnect trench). The specialized $SiO_2$ etch is specifically designed to be used with the invention's Si rich SiON layer. The photolithographic processing used to form this damascene contact is alos benefited by the use of the antireflective coating (ARC) Si rich SiON layer. In order to reduce reflected light, reduce destructive and constructive interference from reflective light, and reduce adverse effects of light reflection during photoresist processing, an antireflective coating (ARC) layer is formed overlying the patterned inlaid conductive region to function as an anti-reflective coating (ARC).

The use of this dielectric phase antireflective coating (ARC) layer provides several advantages. First, the invention's etch and Si-Rich SiON antireflective coating (ARC) layer allow use of a very thin layer. This decreases the RC delay. The antireflective coating (ARC) layer has superior light absorption qualities beyond other known ARC layers when I line photo processing is used. In addition, the dielectric phase of antireflective coating (ARC) layer is non-conductive and will therefore not produce electrical short circuits of the inlaid damascene structure. In addition, the antireflective coating (ARC) layer may be deposited between the two dielectric layers (or oxide layers) to replace the convention SiN layer so that the antireflective coating (ARC) layer can serve the dual purpose of being an antireflective coating and being an etch stop layer used to form the damascene contact. In addition, the antireflective coating (ARC) layer may be deposited directly on top of the underlying conductive region as a barrier layer which prevents atoms of copper or like atoms from diffusing into adjacent dielectric regions.

A second major feature of the invention is the highly selective Si-Rich SiON to $SiO_2$ or SiN etch process. There are two process options are described below.

The Second embodiment of the invention is the Si-Rich SiON self aligned contact (SAC) structure. The Si-Rich SiON self aligned contact (SAC) structure has SiON spacers and capping layers that provide anti-reflective improvements.

The invention provides the following benefits:
By using a Si-rich SiON (RI=2.7 measured at a wavelength of 633 nm) ARC layer having a Si molar percentage between about 58% and 62%, better etch selectivity to oxide than that of SiON (RI=2.0 measured at a wavelength of 633 nm) and conventional PE nitride (RI=2.0 measured at a wavelength of 633 nm) is achieved.

- The thickness of the Si-rich SiON etch-stop layer required for self-aligned dual damascene application can be reduced which decreases the RC delay. The capacitance is inversely proportional to the thickness of the RC delay. Since the invention's Si rich SiON ARC layer and specialized $SiO_2$ etch process has a high selectivity, the Si rich SiON ARC layer can be thinner thus reducing RC delay.
- Dual stack of SiON and Si-rich SiON films is proposed for self-aligned dual damascene application if backend current leakage from Si-rich SiON is a concern.
- Dual stack of LP nitride and Si-rich SiON films as the hardmask and/or spacer is proposed for SAC application. There would be selectivity when removing the LP nitride etch-stop layer, and thus little hardmask and/or spacer would be lost.
- Better via profile can be obtained when using thinner Si-rich SiON etch-stop layer for self-aligned dual damascene application.
- Wider process window can be achieved when using Si-rich SiON film 34 for SAC application.
- Better etch uniformity can be achieved when using Si-rich SiON as an etch-stop layer 34 compared-with that of conventional SiON and PE nitride.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1:
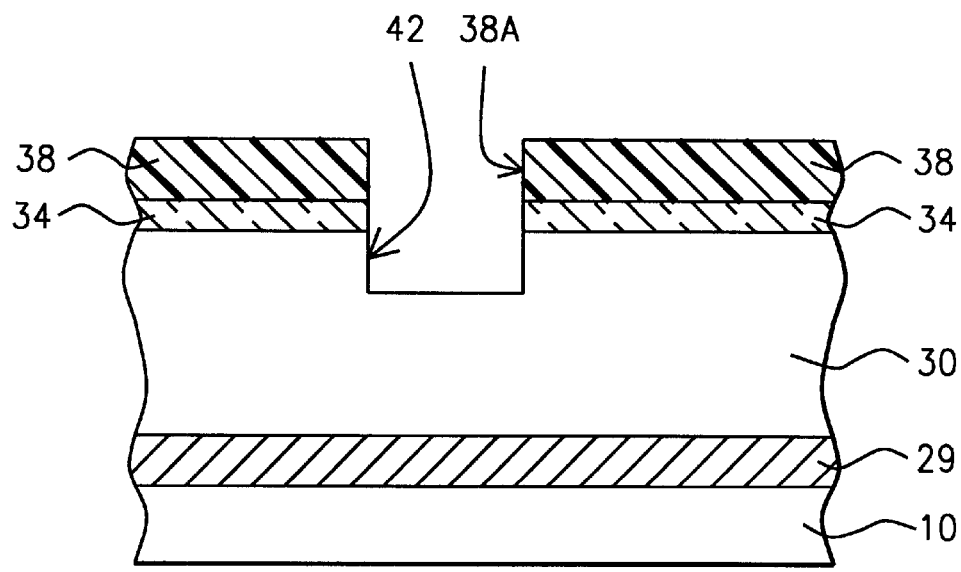
FIGS. 1, 2 and 3 are cross sectional views for illustrating a method for forming a dual damascene structure using a Si-rich SiON ARC layer 34, a special selective Si-Rich $SiO_N$ to $SiO_2$ etch process, and a self aligned contact (SAC) according to the present invention.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not been described in detail in order to not unnecessarily obscure the present invention.

The invention provides a method of forming a Si rich SiON etch barrier layer and two specialized oxide etch processes have the following key elements:

1) SiON rich layer Process
2) Special Silicon oxide Etch process that has a high selectivity of Si-Rich SiON to silicon oxide or SiN.
3) $1^{st}$ embodiment—Dual damascene process (FIGS. 1 to 3) to uses the SiON rich SiON ARC layer 34 and special $SiO_2$ etch processes.
4) $2^{nd}$ embodiment—self aligned contact (SAC) process using Special Si Rich SiON spacer 22 24 and special $SiO_2$ selective etch process.—See FIGS. 4 to 8.

A. Problems the Invention Solves

In previous processes considered by the inventors, a conventional SiON (RI=2.0) layer (e.g. layer 34 see e.g., FIG. 1) (the DUV ARC on Poly process) was be used as the hardmask and etch-stop layer for self-aligned dual damascene application. However, the selectivity of SiON etch-stop layer to oxide is not high enough when etching the oxide to form interconnect and via hole simultaneously. The thickness of SiON layer 34 thus needs to be thick (at least 2000 A) to be a sufficient etch-stop layer. The capacitance would be higher the thicker the SiON layer is used.

LP nitride (RI=2.0) has been used as the hardmask and spacer on Poly and also as the etch-stop layer for self-aligned contact (SAC) etch. There is no selectivity when removing the etch-stop layer after SAC etch, and thus some nitride hardmask and spacer are lost during this step.

1st EMBODIMENT—DUAL DAMASCENE STRUCTURE

A. Overview of the 1st embodiment

Figure 2:
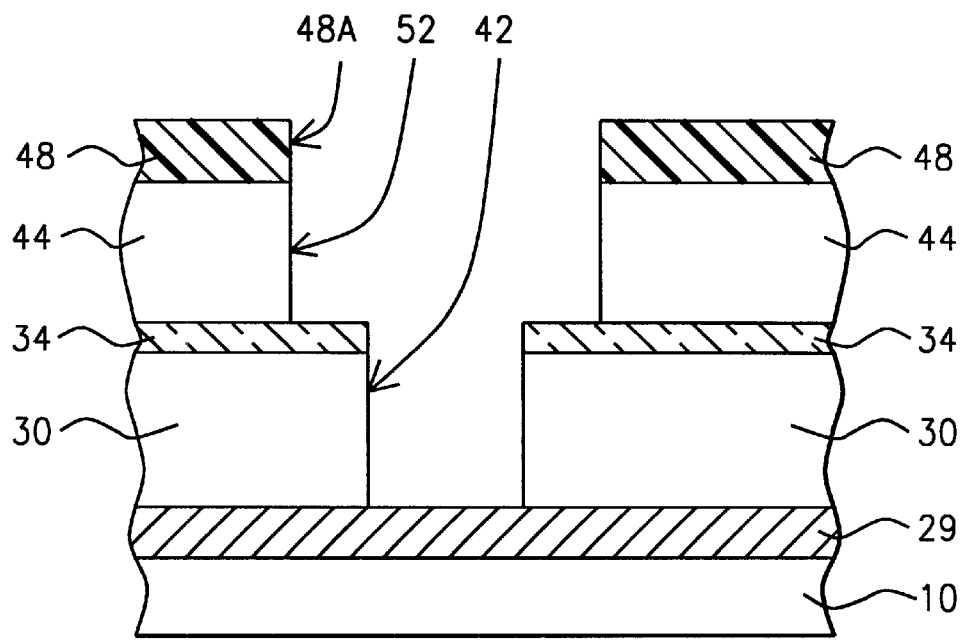
Figure 3:
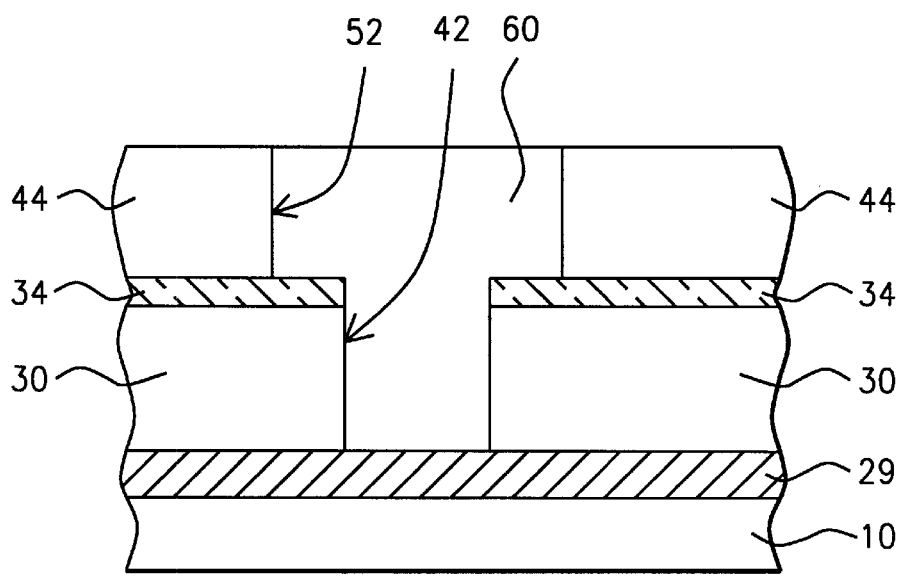

A preferred method of the 1st embodiment is shown below. The 1st embodiment's method preferably comprising the steps of:

a) form a conductive line 29 over the substrate; the conductive line 29 is comprised an Al Alloy;

b) form a first insulating layer 30 overlying the conductive line;

c) form an ARC etch stop layer 34 composed of Si Rich SiON overlying the first insulating layer; the ARC etch stop layer is preferably composed of Si-rich SiON having a Si molar percentage between about 58% and 62% formed by the following process: a Pressure (Torr) between about 4 and 6 Torr, a power between 100 and 150 Watt; an electrode spacing between 450 and 550 mils, a $SiH_4$ flow between 70 and 90 SCCM, a $N_2O$ flow between 30 and 50 SCCM and a He flow between 1900 and 2500 SCCM, at a temperature between 300 and 400° C., and the ARC etch stop layer having a refractive index (RI) between 2.65 and 2.75 measure at 633 nm;

d) from a first photoresist layer 38 overlying the first insulating layer;

e) exposing the first photoresist layer 38 to light to molecularly alter a portion of the first photoresist layer 38 wherein the ARC etch stop layer 34 attenuates light reflected from the conductive region so that the light reflected from the conductive region has a reduced effect on the portion of the first photoresist layer 38 which is molecularly altered; the light has a wavelength within the range of 364 nm to 366 nm;

f) developing the first photoresist layer 38 to form a first photoresist opening 38A;

g) etching the first dielectric layer 30 thorough the first photoresist opening to from a first opening 42;

h) removing the first photoresist layer;

i) from a second insulating layer 44 over the ARC etch stop layer 34 and the first dielectric layer 30;

j) from a second photoresist layer 48 on the second insulating layer 44;

k) expose the second photoresist layer 48 to light to molecularly alter a portion of the second photoresist layer 44 wherein the ARC etch stop layer 34 attenuates light reflected from the conductive region 29 so that the light reflected from the conductive region 29 has a reduced effect on the portion of the second photoresist layer 48 which is molecularly altered;

l) develop the second photoresist layer 48 to form a second photoresist opening 48A;

m) FIG. 2—etch the second insulating layer 44 thorough the second photoresist opening from a second opening 52 and wherein the ARC etch stop layer 34 is used as an etch stop layer; and etching the first insulating layer 30 extending the first opening 42 to expose the conductive line 29; the first and the second openings comprise a dual damascene opening;

n) remove the second photoresist layer;

o) FIG. 3—deposit a metal layer 60 so that the metal layer fills the first and second opening; and p) FIG. 3—planarize the metal layer 60 so that the metal layer forms an electrical interconnect which is electrically coupled to the conductive region 29.

B. Description of the First Embodiment

The first embodiment is shown in FIGS. 1 to 3. To begin, a conductive structure 29 of some type is formed over the substrate or semiconductor structure 10. The conductive structure can be a conductive line. The conductive line can preferably be an Al alloy or Cu alloy line. The semiconductor structure can comprise a wafer, with doped regions formed therein and with gates and other devices formed thereon or thereover. An insulating layer can be formed over the wafer and the conductive line can be formed over the insulating layer.

Subsequently, we form a first insulating layer (IMD) 30 over the conductive line 29. The first insulating layer 30 preferably bas a thickness of between about 5000 and 10,000 A The first insulating layer is preferably composed of Silicon oxide.

C. invention's Si Rich SiON ARC Etch Stop Layer 34

In a key step, the invention's key Si Rich SiON ARC etch stop layer 34 over the first insulating layer 30. A major advantage of the invention is that the ARC Si rich SiON layer 34 can be formed thinner than conventional etch stop layers because of the high etch selectivity between the Si Rich SiON layer 34 and oxide in the invention's subsequent specialized $SiO_2$ etch process. Because the layer 34 is thinner, the capacitance is reduced. The ARC etch stop layer 34 is composed of Si-rich Silicon oxynitride having a Si molar percentage between about 58% and 62% (more preferably 59 to 60%) and a Refractive index between 2.6 and 2.8 (more preferably between 2.68 and 2.72) measured at a wavelength of about 633 nm. In this patent, a Si-Rich SiON layer is defined as having a Si molar percentage between about 58% and 62%. This high refractive index is critical to the invention and the etch selectivity in subsequent etch steps. This invention's Si Rich SiON layer has a higher refractive index than conventional Si-Rich SiON layers. The invention's Si Rich SiON layer 34 preferably has a thickness of between about 500 and 2000 Å and more preferably a thickness of between about 500 and 1000 Å.

The ARC Si-Rich etch stop layer 34 is preferably formed by the following process:

TABLE

Si-rich SiON deposition recipe in DCVD chamber

| Parameters | Low limit | Target | High limit |
| --- | --- | --- | --- |
| Pressure (Torr) | 4 | 5 Torr | 6 |
| power (Watts) | 100 | 130 W | 150 |
| electrode spacing (mils) | 450 | 500 mils | 550 |
| $SiH_4$ (SCCM) | 70 | 80 sccm $SiH_4$ | 90 |
| $N_2O$ (SCCM) | 30 | 40 sccm $N_2O$ | 50 |
| He (SCCM) | 1900 | 2200 sccm He | 2500 |
| temperature (C.) | 300° C. | 350° C. | 400 |
| Refractive index (RI) | 2.5 | 2.7 | 3.0 |

The flow rates can be scaled up or down, keeping the same molar ratios of the gas to use the invention's process in different sized reactors. The most critical parameters for the Anti-Reflection Coating (ARC) properties and the etch selectivity are the $SiH_4$ and $N_2O$ flows.

A first photoresist layer 38 having a first opening 38A is formed by exposing the photoresist layer to a first light and developing the first photoresist layer. The first light preferably has a wavelength corresponding to the I-Line or DUV of mercury with a wavelength of about 365 nm (364 to 366 nm) for I-line and 248 nm (247 to 249 nm for DUV). The invention's SiON ARC layer 34 has superior ARC properties compared to conventional Si Rich SiON layers.

All Photolithography processes in this patent involving the invention's Si rich SiON layer are preferably performed using I-line or DUV light and most preferably use I-line light (364 to 366 nm).

D. First Opening 42 and Second Opening 52

We then pattern the invention's ARC etch stop layer 34 using the first photoresist layer to form a first opening 42 (bottom interconnect opening) at least partially through the first insulating layer 30. The first opening can extend down to the underlying metal line.

The first opening preferably has a depth in a range of between about 11,000 Å and 15,000 Å; and a width between about 0.22 and 0.50 µm.

FIG. 2 shows the step of forming a second insulating layer 44 over the etch stop layer 34. The second insulating layer is preferably composed of silicon oxide, high density plasma (HDP) Undoped Silicate Glass (USG), HDP FSG, or low K SOG materials such as Hydrogen-Silsesquioxane (HSQ). The second insulating layer 44 preferably has a thickness of between about 4000 and 8000 Å.

Still referring to FIG. 2, we form a second photoresist layer 48 having a second photoresist opening 48A over the second insulating layer 44. The second photoresist opening 48A is formed by exposing the second photoresist layer 48 to the first light and developing the second photoresist layer.

The first light preferably has a wavelength corresponding to the I-Line or DUV of mercury with a wavelength of 365 nm (+/−1 nm for I-line) or 248 (+/−1 nm for DUV).

E. Two Special $SiO_2$ Etch Processes

As shown in FIG. 2, we etch the second insulating layer 44, the first insulating layer 30, and the bottom etch stop layer 26 to form a second opening ((top interconnect opening)) 52 in the second insulating layer 44 and to extend the first opening 42 (bottom interconnect opening) to expose the conductive line 29.

There are two preferred special etch processes used with the invention's non-standard high Si Rich SiON layer that have exceptional unexpected Si rich SiON to Silicon oxide etch selectivities. Both etch process are describe below.

F. 1st Etch Process—MxP+ Etcher

The etch of the second insulating layer 44, then first insulating layer, and the bottom etch stop layer 26 to form a second opening ((top interconnect opening)) 52 and to extend said first opening 42 preferably comprises etching a MERIE type oxide etcher model MxP+ by Applied Materials company. The etch process is shown in the table below.

TABLE

1st etch process = Main-etch recipe in MxP+ etcher

| Parameter | Low | tgt | High |
| --- | --- | --- | --- |
| Pressure (torr) | 100 | 150 mtorr | 250 |
| Power (W) | 900 | 1100 W | 1200 |
| $CHF_3$ flow (SCCM) | 60 | 90 sccm $CHF_3$ | 95 |
| $CF_4$ flow (Sccm) | 30 | 10 sccm $CF_4$ | 5 |
| Ar flow (Sccm) | 100 | 150 sccm Ar | 200 |
| Magnetic Field (G) | 0 | 20 | 50 |
| Etch selectivity - Si-rich SiON:oxide | 1:4.2 | 1:5.2 | 1:5.7 |
| Etch selectivity SiON:oxide | 1:2.7 | 1:3.7 | 1:4.2 |
| Etch selectivity PE SiN:oxide | 1:1.5 | 1:2.5 | 1:3 |

The flow rates above can be scaled up or down keeping the same molar % or ratios to accommodate difference sized reactors as is known to those skilled in the art.

The most important parameters of this etch are pressure and $CHF_3/CF_4$ gas ratios. The silicon containing material is hard to etch in an oxide etcher. This process overcomes this problem. In this patent, a SI-Rich SiON layer is defined as having a Si molar percentage between about 58% and 62%.

G. 2nd $SiO_2$ Etch Process—Main-etch Recipe in TCP9100 Etcher:

The etch of the second insulating layer 44, said first insulating layer, and said bottom etch stop layer 26 to form a second opening ((top interconnect opening)) 52 and to extend said first opening 42 comprises the process shown below.

MAIN-ETCH RECIPE IN TCP9100 ETCHER:

| Parameter | Low | tgt | high |
| --- | --- | --- | --- |
| pressure | 1 | 3 mtorr | 15 |
| power | 900 | 1000 W | 1500 |
| bias Power (watts) | 1000 | 1200 W Bias | 1800 |
| $C_2F_6$ flow (sccm) | 7 | 8 sccm | 9 |
| C4F8 (sccm) | 10 | 16 sccm | 20 |
| Ar flow (sccm) | 100 | 150 sccm Ar | 200 |
| Etch selectivity: Si rich SiON:oxide | 1:7 | 1:11.3 | 1:15 |
| Etch selectivity: Si rich SiON:oxide | 1:1.5 | 1:2.7 | 1:4 |

The flow rates above can be scaled up or down keeping the same molar % or ratios to accommodate difference sized reactors as is known to those skilled in the art. The most important parameters in this etch are the pressure, bias/power and the C4F8 gas ratios.

The etch can be performed in a high density plasma (HDP) TCP9100 etcher: type etcher by Lam research company. In this patent, a Si-Rich SiON layer is defined as having a Si molar percentage between about 58% and 62%.

FIG. 3 show the deposition of a metal layer 60 so that the metal layer fills the first and second opening. Next, the metal layer 60 is planarized so that the metal layer forms an electrical interconnect which is electrically coupled to the conductive region 29.

SECOND EMBODIMENT—SAC WITH HARD MASK AND SPACERS FORMED OF Si Rich SiON

A. Overview of the Second Embodiment

FIGS. 4 through 8 show a preferred $2^{nd}$ embodiment where a self aligned contact (SAC) is formed using special Si Rich Silicon oxynitride spacer layers on the gate electrode 14 and a Si Rich SiON hard mask 18.

The key aspects of the invention for the $2^{nd}$ embodiment are:

Si rich SiON top hard mask layer 18 and Si rich SiON $2^{nd}$ spacer 24 oxide etch process to etch oxide layer 30 but is highly selective to the Si rich SiON top hard mask layer 18 and $2^{nd}$ spacer 24.

An overview of the major steps of the second embodiment is shown below.

The $2^{nd}$ embodiment includes the following steps:

a) form a polysilicon layer over a substrate 10;

b) form a hard mask layer on the polysilicon layer; the hard mask layer 16 18 comprised of a bottom hard mask 16 on a Silicon oxynitride hard mask 18;

the silicon oxynitride hard mask 18 is preferably composed of Si-rich SiON having a Si molar percentage between about 58% and 62% formed by the following process: a Pressure (Torr) between about 4 and 6 Torr, a power between 100 and 150 Watt; an electrode spacing between 450 and 550 mils, a SiH$_4$ flow between 70 and 90 SCCM, a N$_2$O flow between 30 and 50 SCCM and a He flow between 1900 and 2500 SCCM, at a temperature between 300 and 400° C., and the silicon oxynitride hard mask having a refractive index (RI) between 2.65 and 2.75 measure at 633 nm;

c) patterning the hard mask layer 16 18 to form a hard mask 16 18 that defines a gate electrode 14; the gate electrode 18 having sidewalls;

d) pattern the polysilicon layer, using the hard mask 16 18 as an etch mask, to form the gate electrode 14;

e) form first spacers 22 on the sidewalls 22 of the gate electrode 18; the first spacers composed of silicon nitride or oxide formed using a LP TEOS process;

f) form second spacers 24 over the first spacers 22; the second spacers are composed of Si-rich SiON having a Si molar percentage between about 58% and 62% formed by the following process: a Pressure (Torr) between about 4 and 6 Torr, a power between 100 and 150 Watt; an electrode spacing between 450 and 550 mils, a SiH$_4$ flow between 70 and 90 SCCM, a N$_2$O flow between 30 and 50 SCCM and a He flow between 1900 and 2500 SCCM, at a temperature between 300 and 400° C., and the second spacers having a refractive index (RI) between 2.65 and 2.75 measure at 633 nm;

g) form a bottom etch stop layer 26 composed of silicon nitride over the second spacers 24, and elsewhere over the substrate 10;

h) form a first insulating layer (IMD) 30 over the bottom etch stop layer 26;

i) form an ARC etch stop layer 34 over the first insulating layer 30; the ARC etch stop layer 34 is composed of Si-rich Silicon oxynitride having a Si molar percentage between about 58% and 62% and a Refractive index between 2.68 and 2.72 at a wavelength of about 633 mn; the ARC etch stop layer 34 is composed of Si-rich SiON formed by the following process: a Pressure (Torr) between about 4 and 6 Torr, a power between 100 and 150 Watt; an electrode spacing between 450 and 550 mils, a SiH4 flow between 70 and 90 SCCM, a N$_2$O flow between 30 and 50 SCCM and a He flow between 1900 and 2500 SCCM, at a temperature between 300 and 400° C., and the ARC etch stop layer 34 having a refractive index (RI) between 2.65 and 2.75 nm measured at a wavelength of about 633 nm;

j) form a first photoresist layer 38 having a first opening 38A by exposing the photoresist layer to a first light and developing the first photoresist layer;

k) pattern the ARC etch stop layer 34 using the first photoresist layer to form a first etch stop opening through the ARC etch stop layer;

l) etch the first insulating layer 30 to form a contact opening 43 exposing the substrate;

m) etch the first insulating layer 44, is preformed at the following: a Pressure (torr) between 100 and 250 mtorr, a Power (W) between 900 and 1200 W; a CHF$_3$ flow between 60 and 95 sccm; a CF$_4$ flow (Sccm) between 5 and 30 sccm, a Ar flow (Sccm) between 100 and 200 sccm Ar, a Magnetic Field between 0 and 50 G; an etch selectivity between Si-rich SiON: oxide between 1:4.2 and 1:5.7; and an etch selectivity SiON: oxide between 1:2.7 and 1:4.2; an etch selectivity PE SiN: oxide between 1:1.5 and 1:3.

B. SAC Structure—FIGS. 4 to 8

FIGS. 4 through 8 show a preferred 2$^{nd}$ embodiment where a self aligned contact (SAC) is formed using special Si Rich Silicon oxynitride spacer layers on the gate electrode 14 and a Si Rich SiON hard mask 18.

Figure 4:
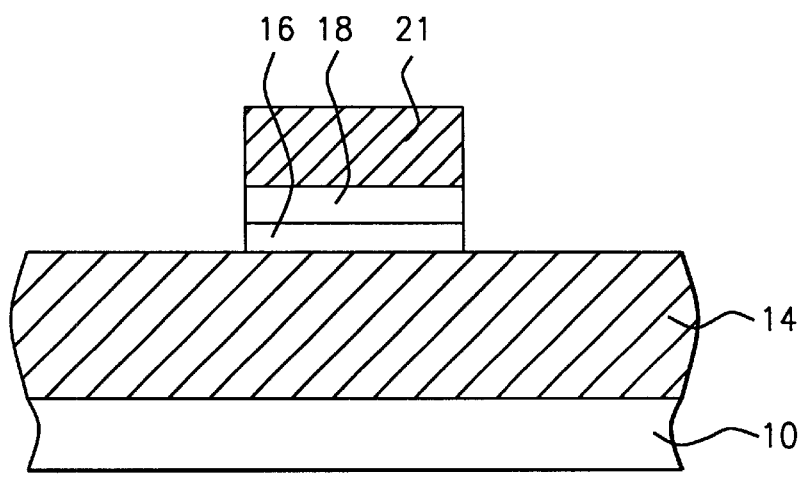
FIGS. 4, 5, 6, 7 and 8 are cross sectional views for illustrating a method for forming a self aligned contact (SAC) to a conductive line 29 using a Si rich SiON hard mask 18, a Si rich SiON second spacer 24, a Si-rich SiON ARC layer 34A, and a special selective Si-Rich Silicon oxynitride layer 34 to $SiO_2$ etch process, according to the present invention.

Referring to FIG. 4, to from the SAC structure, a gate oxide layer (not shown), a polysilicon layer 14 and a hard mask layer consisting of a Si rich SiN layer 18 over a bottom hard mask layer 16 are formed over a substrate 10. The polysilicon layer 14 can be comprised of multiple layers and can be comprised of metals, polycides and other conductive materials used in gates and conductive lines.

The hard mask 16 18 is comprised of a Si-Rich Silicon oxynitride ARC hard mask 18 on a bottom hard mask layer 16. Bottom hard mask layer 16 can be comprised of LP nitride, SiON or LP TEOS oxide. The invention's key Si Rich SiON ARC layer 18 is formed as described above in the first embodiment. The Si Rich SiON ARC layer 18 preferably has a thickness of between about 500 and 2000 Å and more preferably a thickness of between about 500 and 1000 Å.

Figure 5:
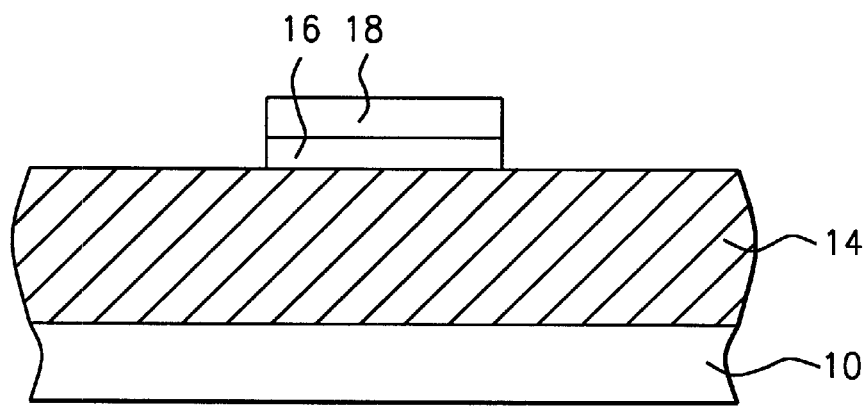

As shown in FIGS. 4 & 5, the hard mask layer 16 18 is patterned using a photoresist layer 21 to form a hard mask 16 18 that defines a gate electrode 14. The photoresist is exposed preferably using I-line light. All Photolithography processes in this patent involving the invention's Si rich SiON layer are preferably performed using I-line or DUV light and most preferably use I-line light (364 to 366 nm). The photoresist layer is then removed.

Figure 6:
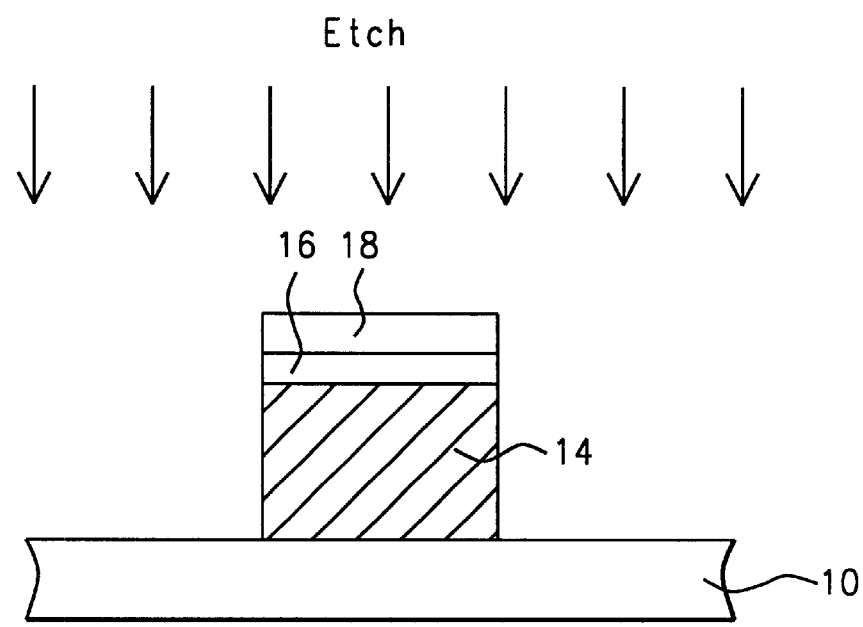
Figure 7:
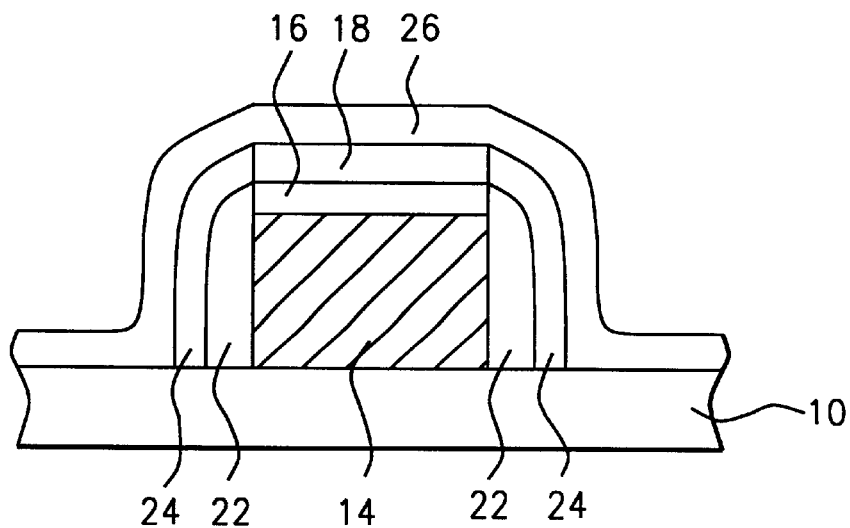

FIG. 6 shows the etch of the polysilicon layer 14 using the hard mask 16 18 as an etch mask, to form the gate electrode 14. The gate electrode 18 has sidewalls.

C. First and Second Spacers 22 24 and Etch Barrier Layer

Next, first spacers 22 preferably composed of Silicon nitride, LP nitride, LP TEOS, or Silicon oxide, are formed on the sidewalls 22 of the gate electrode or conductive line 18. Spacers are formed using conventional coating and anisotropic etch back steps.

Next, the invention's key Si rich Silicon oxynitride spacers (Second spacers) 24 are formed over the first spacer 22. The Si rich Silicon oxynitride 2$^{nd}$ spacers are formed using the invention's process for forming Si rich SiON as describe above in the Si rich Silicon oxynitride 2$^{nd}$ spacers preferably have a thickness of between about 500 and 1000 Å.

A bottom etch stop layer 26 preferably composed of silicon nitride is formed over the Si Rich spacer 24, the hard mask 16 18 and elsewhere over the substrate 10.

D. ILD Layer 30 and SAC Etch

Figure 8:
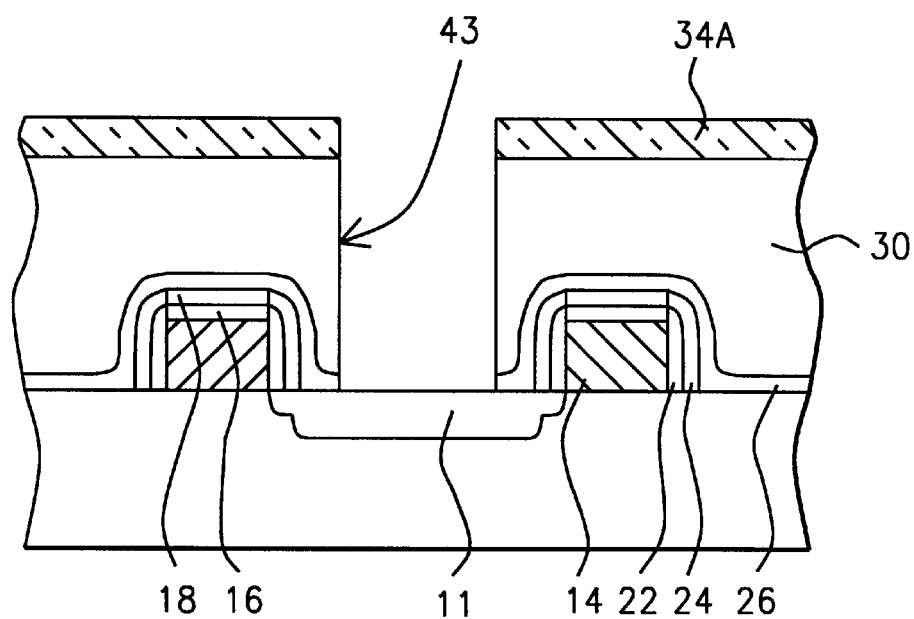

Referring to FIG. 8, Subsequently, we form a first insulating layer (ILD) 30 over the bottom etch stop layer 26. The first insulating layer 30 preferably has a thickness of between about 5000 and 10,000 Å. The first insulating layer is preferably composed of Silicon oxide.

Optionally, the inventions Si Rich SiON layer 34A can be used as a hard mask over the ILD layer 30. The Si Rich SiON layer 34A preferably has a thickness of between about 500 and 1000 Å.

A first etch stop opening is formed in the Si Rich SiON layer 34A.

Next, a contact opening 43 is formed exposing the substrate, including doped regions 11. The contact opening is preferably formed using one of the two oxide etch processes described in the first embodiment.

The invention's Si Rich SiON layer has a high etch selectivity to SiON and ensures that the spacer 24 and hard mask 18 are not etched down (thinned) by the contact opening etch.

SUMMARY AND BENEFITS

The invention provides a method of forming a Si rich SiON etch barrier layer and two specialized oxide etch processes have the following key elements:

1) SiON rich layer Process
2) Special Silicon oxide Etch process that has a high selectivity of Si-Rich SiON to silicon oxide or SiN.
3) 1$^{st}$ embodiment—Dual damascene process (FIGS. 1 to 3) to uses the SiON rich layer 34 and special SiO$_2$ etch process.
4) 2$^{nd}$ embodiment—self aligned contact (SAC) process using Special Si Rich SiON spacer 22 24 and special SiO$_2$ selective etch process—See FIGS. 4 to 8.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a self-aligned contact to a substrate using a Si Rich Silicon oxynitride etch barrier layer and a Si Rich spacer; comprising the steps of:
    a) forming a polysilicon layer over a substrate;
    b) forming a hard mask layer on said polysilicon layer; said hard mask layer comprised of a bottom hard mask on a Silicon oxynitride hard mask;
        (b-1) said Silicon oxynitride hard mask is composed of Si-rich SiON having a Si molar percentage between about 58% and 62%, formed by the following process: a Pressure (Torr) between about 4 and 6 Torr, a power between 100 and 150 Watt; an electrode spacing between 450 and 550 mils, a SiH$_4$ flow between 70 and 90 SCCM, a N$_2$O flow between 30 and 50 SCCM and a He flow between 1900 and 2500 SCCM, at a temperature between 300 and 400° C., and said silicon oxynitride layer having a refractive index (RI) between 2.65 and 2.75 measure at 633 nm;
    c) patterning said hard mask layer to form a hard mask that defines a gate electrode; said gate electrode having sidewalls;
    d) patterning said polysilicon layer, using said hard mask as an etch mask, to form said gate electrode;
    e) forming first spacers on said sidewalls of said gate electrode; said first spacers are composed of silicon nitride or oxide formed using a LP TEOS process;
    f) forming second spacers over said first spacers;
        (f-1) said second spacers are composed of Si-rich SiON having a Si molar percentage between about 58% and 62% formed by the following process: a Pressure (Torr) between about 4 and 6 Torr, a power between 100 and 150 Watt; an electrode spacing between 450 and 550 mils, a SiH$_4$ flow between 70 and 90 SCCM, a N$_2$O flow between 30 and 50 SCCM and a He flow between 1900 and 2500 SCCM, at a temperature between 300 and 400° C., and said second spacers having a refractive index (RI) between 2.65 and 2.75 measure at 633 nm;
    g) forming a bottom etch stop layer composed of silicon nitride over said second spacers, and elsewhere over said substrate;
    h) forming a first insulating layer (IMD) over said bottom etch stop layer;
    i) forming an ARC etch stop layer over said first insulating layer;
        (i-1) said ARC etch stop layer is composed of Si-rich Silicon oxynitride having a Si molar percentage between about 58% and 62% and a Refractive index between 2.65 and 2.75 at a wavelength of about 633 nm;
    j) forming a first photoresist layer over said ARC etch stop layer, said first photoresist layer having a first opening by exposing said photoresist layer to a first light and developing said first photoresist layer;
    k) patterning said ARC etch stop layer using said first photoresist layer to form a contact opening through said first insulating layer exposing said substrate.

2. The method of claim 1 wherein said ARC etch stop layer is composed of Si-rich SiON formed by the following process: a Pressure (Torr) between about 4 and 6 Torr, a power between 100 and 150 Watt; an electrode spacing between 450 and 550 mils, a SiH$_4$ flow between 70 and 90 SCCM, a N$_2$O flow between 30 and 50 SCCM and a He flow between 1900 and 2500 SCCM, at a temperature between 300 and 400° C., and said ARC etch stop layer having a refractive index (RI) between 2.68 and 2.72 nm measured at a wavelength of about 633 nm.

3. The method of claim 1 wherein the etch of the said first insulating layer, is preformed at the following: a Pressure (torr) between 100 and 250 mtorr, a Power (W) between 900 and 1200 W; a CHF$_3$ flow between 60 and 95 sccm; a CF$_4$ flow (Sccm) between 5 and 30 sccm, a Ar flow (Sccm) between 100 and 200 sccm Ar, a Magnetic Field between 0 and 50 G; an etch selectivity between Si-rich SiON: oxide between 1:4.2 and 1:5.7; and an Etch selectivity SiON: oxide between 1:2.7 and 1:4.2; an etch selectivity PE nitride: oxide between 1:1.5 and 1:3.

4. A method of fabricating a self-aligned contact to a substrate using a Si Rich Silicon oxynitride etch barrier layer and a Si Rich spacer; comprising the steps of:
    a) forming a polysilicon layer over a substrate;
    b) forming a hard mask layer on said polysilicon layer; said hard mask layer comprised of a bottom hard mask on a Silicon oxynitride hard mask;
        (b-1) said silicon oxynitride hard mask is composed of Si-rich SiON having a Si molar percentage between about 58% and 62% formed by the following process: a Pressure (Torr) between about 4 and 6 Torr, a power between 100 and 150 Watt; an electrode spacing between 450 and 550 mils, a SiH$_4$ flow between 70 and 90 SCCM, a N$_2$O flow between 30 and 50 SCCM and a He flow between 1900 and 2500 SCCM, at a temperature between 300 and 400° C., and said silicon oxynitride hard mask having a refractive index (RI) between 2.65 and 2.75 measure at 633 nm;
    c) patterning said hard mask layer to form a hard mask that defines a gate electrode; said gate electrode having sidewalls;
    d) patterning said polysilicon layer, using said hard mask as an etch mask, to form said gate electrode;
    e) forming first spacers on said sidewalls of said gate electrode; said first spacers composed of silicon nitride or oxide formed using a LP TEOS process;
    f) forming second spacers over said first spacers;
        (f-1) said second spacers are composed of Si-rich SiON having a Si molar percentage between about 58% and 62% formed by the following process: a Pressure (Torr) between about 4 and 6 Torr, a power between 100 and 150 Watt; an electrode spacing between 450 and 550 mils, a SiH$_4$ flow between 70 and 90 SCCM, a N$_2$O flow between 30 and 50 SCCM and a He flow between 1900 and 2500 SCCM, at a temperature between 300 and 400° C., and said second spacers having a refractive index (RI) between 2.65 and 2.75 measure at 633 nm;

g) forming a bottom etch stop layer composed of silicon nitride over said second spacers, and elsewhere over said substrate;

h) forming a first insulating layer (IMD) over said bottom etch stop layer;

i) forming an ARC etch stop layer over said first insulating layer;

(i-1) said ARC etch stop layer is composed of Si-rich Silicon oxynitride having a Si molar percentage between about 58% and 62% and said ARC etch stop layer is composed of Si-rich SiON formed by the following process: a Pressure (Torr) between about 4 and 6 Torr, a power between 100 and 150 Watt; an electrode spacing between 450 and 550 mils, a SiH$_4$ flow between 70 and 90 SCCM, a N$_2$O flow between 30 and 50 SCCM and a He flow between 1900 and 2500 SCCM, at a temperature between 300 and 400° C., and said ARC etch stop layer having a refractive index (RI) between 2.65 and 2.75 nm measured at a wavelength of about 633 nm;

j) forming a first photoresist layer over said ARC etch stop layer, said first photoresist layer having a first opening by exposing said photoresist layer to a first light and developing said first photoresist layer;

k) patterning said ARC etch stop layer using said first photoresist layer to form a first etch stop opening through said ARC etch stop layer; and l) etching said first insulating layer to form a contact opening exposing said substrate, the etching of said first insulating layer, is preformed at the following: a Pressure (torr) between 100 and 250 mtorr, a Power (W) between 900 and 1200 W; a CHF$_3$ flow between 60 and 95 seem; a CF$_4$ flow (Sccm) between 5 and 30 sccm, a Ar flow (Sccm) between 100 and 200 sccm Ar, a Magnetic Field between 0 and 50 G; an etch selectivity between Si-rich SiON: oxide between 1:4.2 and 1:5.7; and an etch selectivity SiON:oxide between 1:2.7 and 1:4.2;

an etch selectivity PE SiN:oxide between 1:1.5 and 1:3.

* * * * *